(12) United States Patent
Miura

(10) Patent No.: US 6,914,869 B1
(45) Date of Patent: Jul. 5, 2005

(54) OPTICAL PICKUP FOR CD/DVD COMPATIBLE PLAYER

(75) Inventor: Akira Miura, Tokorozawa (JP)

(73) Assignee: Pioneer Corporation, Tokyo (JP)

(*) Notice: Subject to any disclaimer, the term of this patent is extended or adjusted under 35 U.S.C. 154(b) by 619 days.

(21) Appl. No.: 09/695,050

(22) Filed: Oct. 25, 2000

(30) Foreign Application Priority Data

Oct. 26, 1999 (JP) .......................................... 11-303983

(51) Int. Cl.[7] .............................................. G11B 7/00
(52) U.S. Cl. ................................ 369/112.01; 369/121
(58) Field of Search ...................... 369/112.23, 112.01, 369/53.2, 53.22, 120, 121, 122

(56) References Cited

U.S. PATENT DOCUMENTS

| | | | |
|---|---|---|---|
| 5,392,268 A | | 2/1995 | Rokutan |
| 5,463,609 A | | 10/1995 | Inagaki et al. |
| 5,831,960 A | * | 11/1998 | Jiang et al. ................. 369/121 |
| 5,933,401 A | | 8/1999 | Lee et al. .................... 369/112 |
| 6,038,204 A | * | 3/2000 | Yang et al. ................. 369/121 |
| 6,084,843 A | * | 7/2000 | Abe et al. ................... 369/112 |
| 6,504,812 B2 | * | 9/2000 | Taniguchi et al. .......... 369/121 |

FOREIGN PATENT DOCUMENTS

| | | |
|---|---|---|
| EP | 0 831 472 | 3/1998 |
| EP | 0 838 813 | 4/1998 |
| JP | 10-261240 | 9/1998 |

OTHER PUBLICATIONS

Abstract of JP 10–261240 (Sep. 29, 1998), Patent Abstract of Japan, vol. 1998, No. 14.

Yamada, M. et al., "DVD/CD/CD–R Compatible Pick–Up with Two–Wavelength Two–Beam Laser" IEEE Transactions on Consumer Electronics, IEEE Inc. New York, U.S., vol. 44, No. 3, pp. 591–600 (Aug. 1998).

\* cited by examiner

*Primary Examiner*—Nabil Hindi
(74) *Attorney, Agent, or Firm*—Morgan, Lewis & Bockius LLP

(57) ABSTRACT

A monolithic double-wavelength semiconductor laser diode is provided in a DVD/CD compatible player to suppress deterioration in the optical characteristics of a reading light spot. A laser diode is a monolithic element which has two light emitting points on a single substrate for emitting two different laser beams having different wavelengths with each other. A central line of a main laser beam for use in reproducing DVDs is positioned closer to the optical axis Y of an optical system than a central line of a laser beam for use in reproducing CDs. In another arrangement, the central line of a main laser beam for use in reproducing DVDs is positioned so as to be coincident with the optical axis Y of the optical system.

8 Claims, 6 Drawing Sheets

OPTICAL PICKUP FOR CD/DVD COMPATIBLE PLAYER

FIELD OF THE INVENTION

The present invention relates generally to an optical pickup for emitting a plurality of laser beams having different wavelengths to read information signals from a plurality of different types of recording media, and more particularly to an optical pickup apparatus for DVDs and CDs.

BACKGROUND OF THE INVENTION

Generally, a semiconductor laser diode is used as a light source for an optical pickup for reproducing optical recording media such as CDs and DVDs.

For satisfactorily reproducing the recording media, semiconductor laser diodes having different light emitting wavelengths and objective lenses with different numerical apertures (NA) should be provided for reproducing CD and DVD, respectively. For example, a laser diode emitting a laser beam at wavelength of 650 nm and an objective lens having NA of 0.6 is used for reproducing DVDs, while a laser diode emitting a laser beam at wavelength of 780 nm and an objective lens having NA of 0.45 is used for reproducing CDs.

For enabling a single player to reproduce different types of discs such as CD and DVD, an optical pickup incorporating a light source for emitting two laser beams having different wavelengths, i.e., 650 nm and 780 nm has been considered. FIG. 1 illustrates an example of such an optical pickup.

The optical pickup illustrated in FIG. 1 comprises a laser diode 1 for emitting a laser beam having a wavelength of 650 nm; a laser diode 2 for emitting a laser beam having a wavelength of 780 nm; a combining prism 3; a half mirror 4; a collimator lens 5; and an objective lens 6. These components are arranged in the above order. Further, on another optical axis branching from the half mirror 4, a photodetector 7 is arranged. This optical system is configured so that an optical path from the laser diode to the combining prism 3 for CD reproduction is different from that for DVD reproduction and an optical path from the combining prism 3 to a recording medium 8 for CD reproduction is substantially identical with that for DVD reproduction. Thus, the light beams emitted from the respective laser diodes travel to the recording medium 8 along an optical axis Y after passing through the combining prism 3.

The above-mentioned configuration, however, requires a large number of elements including the combining prism, which results in a high cost. In addition, the two laser diodes must be aligned with the combining prism, creating a complicated configuration as well as difficulties in adjusting the alignment.

In view of the problem mentioned above, an object of the present invention is to provide an optical pickup apparatus having a simplified configuration for using a plurality of laser beams having different wavelengths to reduce the size of the apparatus.

SUMMARY OF THE INVENTION

In one aspect, the present invention provides an optical pickup apparatus for reading information recorded on two types of recording media at different reading wavelengths from each other, including a first light emitting portion for emitting a first laser beam having a first wavelength; a second light emitting portion for emitting a second laser beam having a second wavelength longer than the first wavelength; and an optical system for guiding each of the first and second laser beams to the recording medium and for guiding a reflected beam from the recording medium to a photodetector. In the optical pickup apparatus, the first light emitting portion and the second light emitting portion are formed on a single substrate of one chip, and the central axis of the first laser beam is closer to the optical axis of the optical system than the central axis of the second laser beam.

In another aspect, the present invention provides an optical pickup apparatus for reading information recorded on two types of recording media at different reading wavelengths from each other, including a first light emitting portion for emitting a first laser beam at a first wavelength; a second light emitting portion for emitting a second laser beam at a second wavelength longer than the first wavelength; and an optical system for guiding each of the first and second laser beams to the recording medium associated therewith and for guiding a reflected beam from the recording medium to a photodetector. In the optical pickup apparatus, the first light emitting portion and the second light emitting portion are formed on a single substrate of one chip, and a central axis the first laser beam is positioned so that the central axis is substantially coincident with an optical axis of the optical system.

In a further aspect, the present invention provides an optical pickup apparatus for reading information recorded on two types of recording media at different reading wavelengths from each other, including a first light emitting portion for emitting a first laser beam at a first wavelength; a second light emitting portion for emitting a second laser beam at a second wavelength longer than the first wavelength; and an optical system for guiding each of the first and second laser beams to the recording medium associated therewith and for guiding a reflected beam from the recording medium to a photodetector, wherein the optical system includes an objective lens for limiting an aperture for a beam incident thereon. In the optical pickup apparatus, the first light emitting portion and the second light emitting portion are formed on a single substrate of one chip, and a central axis of the first laser beam is closer to an optical axis of the optical system than the central axis of the second laser beam.

In a further aspect, the present invention provides an optical pickup apparatus for reading information recorded on two types of recording media at different reading wavelengths from each other, including a first light emitting portion for emitting a first laser beam at a first wavelength; a second light emitting portion for emitting a second laser beam at a second wavelength longer than the first wavelength; and an optical system for guiding each of the first and second laser beams to the recording medium associated therewith and for guiding a reflected beam from the recording medium to a photodetector, wherein the optical system includes an objective lens for limiting an aperture to a beam incident thereon. In the optical pickup apparatus, the first light emitting portion and the second light emitting portion are formed on a single substrate of one chip, and a central axis of the first laser beam is positioned so that the central axis is substantially coincident with the optical axis of the optical system.

According to the present invention, a main light beam of the first laser beam having a shorter wavelength is coincident with the optical axis of the optical system. In another arrangement, the first laser beam is closer to the optical axis of the optical system than the central axis of the second laser beam having a longer wavelength than the first laser beam. Therefore, deteriorations in the optical characteristics of a light spot on the recording surface are minimized even when the optical pickup of the present invention is used to reproduce any of a plurality of recording media with various reading wavelengths.

BRIEF DESCRIPTION OF THE DRAWINGS

The aforementioned aspects and other features of the invention are explained in the following description, taken in connection with the accompanying drawing figures wherein.

DETAILED DESCRIPTION OF THE PREFERRED EMBODIMENTS

Preferred embodiments according to the present invention will hereinafter be described in detail with reference to FIGS. 2–5.

Figure 1:
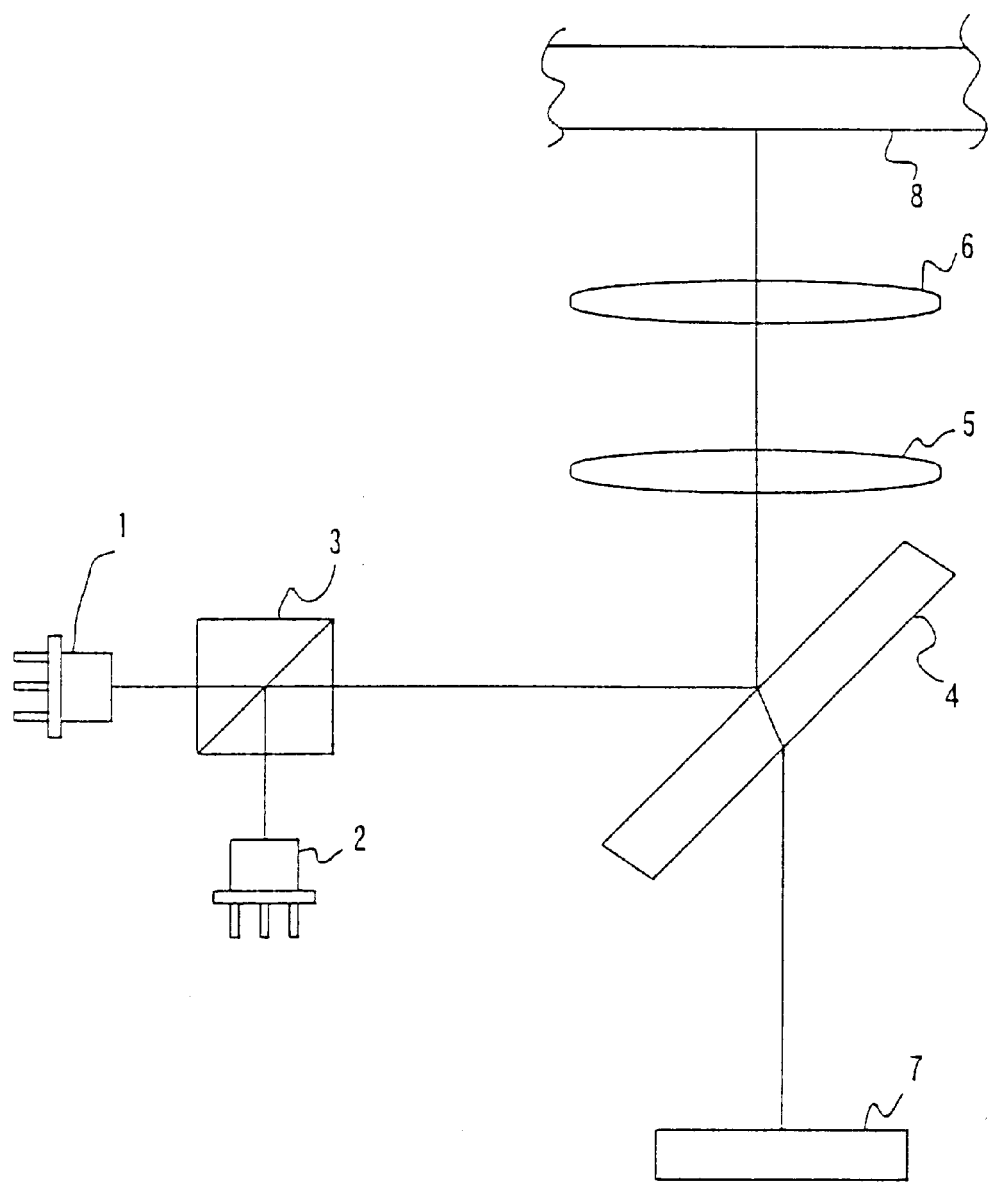
FIG. 1 is a diagram illustrating a conventional optical pickup.
Figure 2:
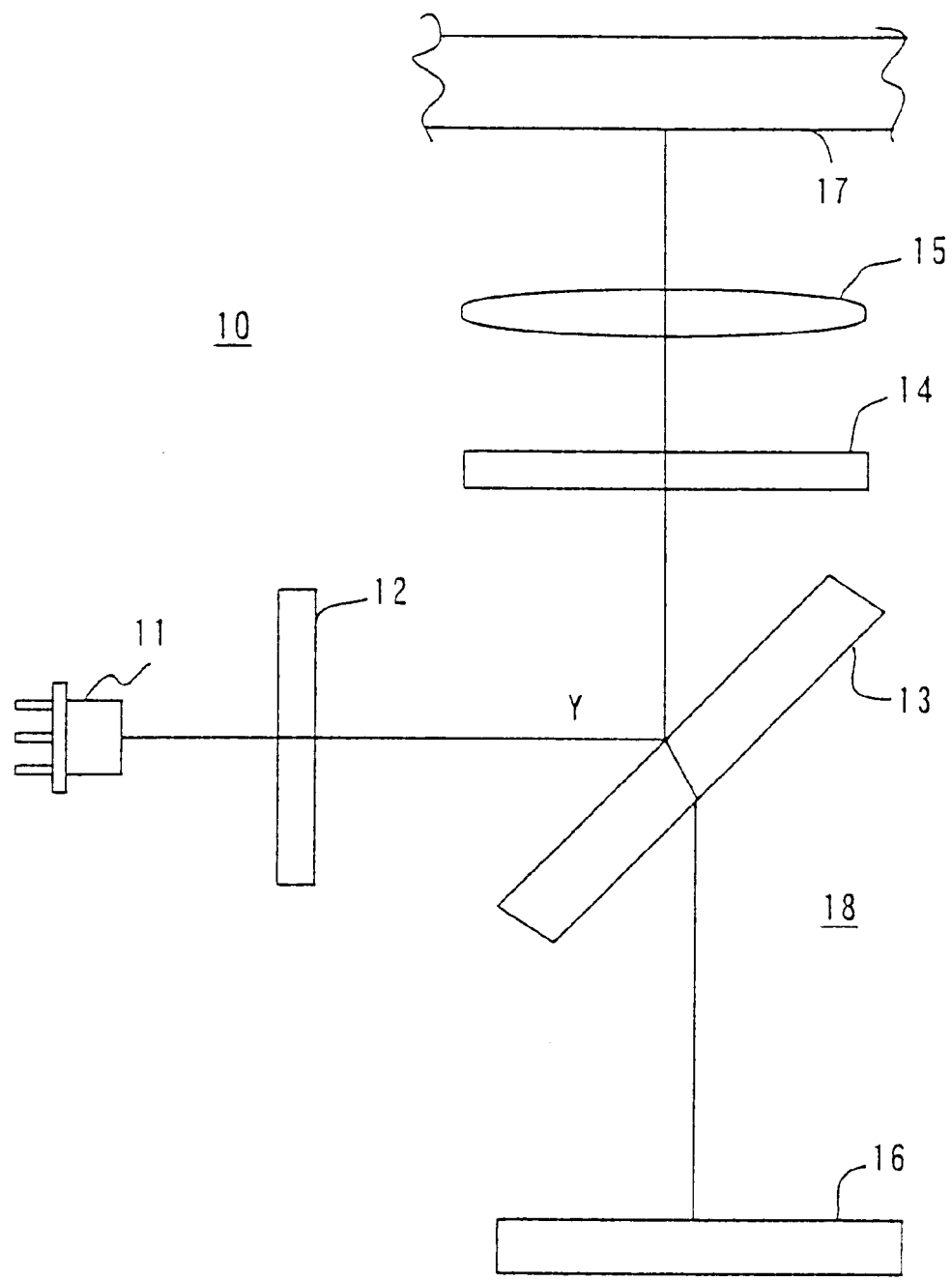
FIG. 2 is a diagram illustrating an embodiment of an optical pickup according to the present invention.

FIG. 2 illustrates an embodiment of an optical pickup incorporated in a CD/DVD compatible player to which the present invention is applied. In FIG. 2, the optical pickup 10 comprises a semiconductor laser diode 11 for emitting two laser beams having different wavelengths with each other. The optical pickup 10 also comprises a collimator lens 12, a half mirror 13, an aperture limiting element 14, and an objective lens 15, which are arranged in the above order on an optical axis Y. Along another optical axis extending from the half mirror 13, the optical pickup 10 has an optical system 18 including a photodetector 16. An optical axis Y of the optical system 18 is aligned with a central axis of the objective lens 15.

Figure 3:
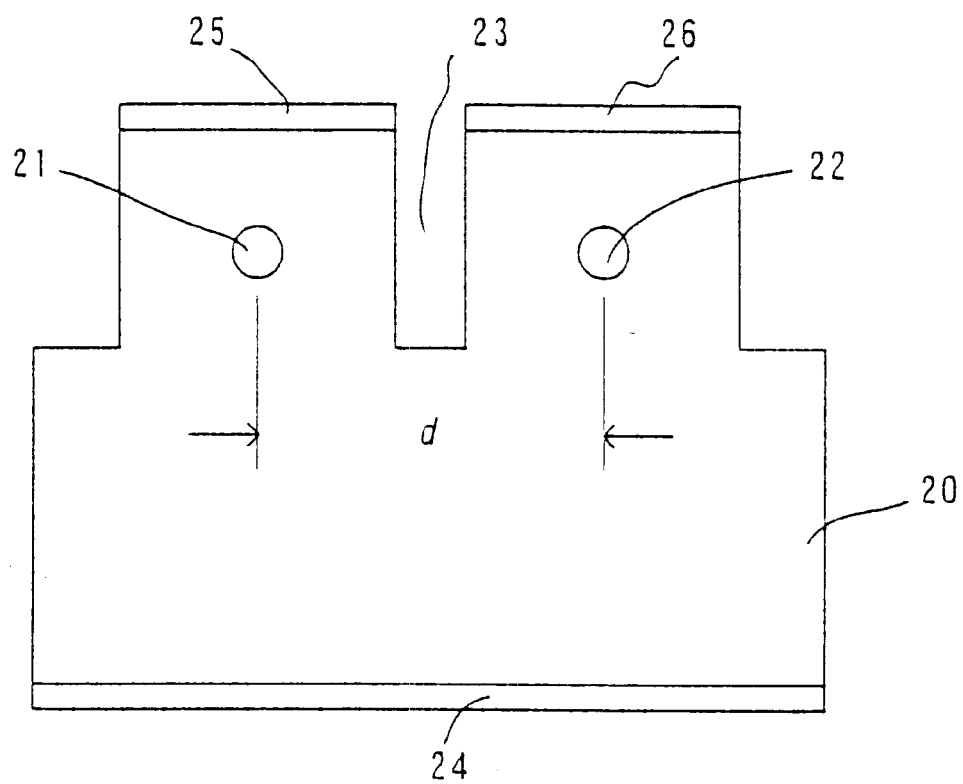
FIG. 3 is a cross section illustrating a semiconductor laser diode.

FIG. 3 illustrates an example of the semiconductor laser diode 11. The illustrated laser diode 11 is a monolithic laser diode for emitting two laser beams having different wavelengths from each other. The semiconductor laser diode 11 is formed in one-chip configuration. The semiconductor laser diode 11 has a first light emitting portion 21 having a first light emitting point A1 for emitting a first laser beam at a wavelength of 650 nm; a second light emitting point 22 having a second light emitting point A2 for emitting a second laser beam at a wavelength of 780 nm; a separation groove 23 which separates the first light emitting portion 21 from the second light emitting portion 22; and a back electrode 24 on the other main surface of a substrate 20 for providing a common electrode for the two light emitting portions 21, 22. Further, an electrode 25 is formed for the first light emitting portion 21, and an electrode 26 is formed for the second emitter 22.

It should be noted that a "one-chip" element, as used in the present invention, refers to a monolithic element. The following will be presented for explaining the monolithic element. In a single manufacturing process of the semiconductor laser diode 11, respective layers constituting the first light emitting portion and the second light emitting portion are formed on a single substrate by means of deposition and patterning processes, respectively. Subsequently, the substrate is diced into each unit configuration. Then, each unit undergoes processes such as bonding and molding to form a common back electrode on the back surface of the substrate opposite to the surface on which the respective light emitting portions are formed. Therefore, the "one-chip" element of the present invention does not include a structure for adhering two laser diodes for emitting a laser beam having one wavelength or a structure for mounting two separate laser diodes on a single substrate.

The semiconductor laser diode 11 selectively emits the first laser beam and the second laser beam on the basis of a control signal from a laser driver (not shown). The semiconductor laser diode 11 does not emit the two beams simultaneously. However, a central axis X1 of the first laser beam is substantially parallel with a central axis X2 of the second laser beam with a spacing d defined therebetween. It should be noted that the central axis of a laser beam in the present invention refers to a line which passes a light intensity distribution center on the cross-section of the laser beam.

The aperture limiting element 14 may be an aperture diaphragm, for example, which limits a beam passing through the aperture limiting element 14.

The photodetector 16 comprises multiple divided light receiving elements, each of which generates an output signal corresponding to incident beam intensity. The output signal of the photodetector 16 is sent to a detector circuit system (not shown).

In the configuration described above, a laser beam emitted from the laser diode 11, either the first beam or the second beam, passes through the collimator lens 12 so as to be a parallel beam, which is reflected by the half mirror 13. The reflected beam is limited in beam diameter by the aperture limiting element 14, and enters the objective lens 15. The objective lens 15 focuses the beam on a recording surface of a recording medium 17 to form a light spot. The beam modulated by information pits on the recording surface and reflected therefrom passes through the objective lens 15 and returns to the half mirror 13. Then, the beam is separated from the optical path extending from the laser diode 11, and impinges on the photodetector 16. That is, the optical system 18 is configured so that an optical path of the first beam is substantially identical with an optical path of the second beam.

The photodetector 16 detects the incident beam intensity on each of the light receiving elements. The photodetector 16 then generates a read signal, a focus error signal, and a tracking error signal based on output signals of the respective light receiving elements. An actuator (not shown), composed of a magnetic circuit and a coil, controls the objective lens 15 and the aperture limiting element 14 in both focusing and tracking directions based on the focus and tracking error signals to maintain the light spot on an information track at all times.

Next, the positioning of the semiconductor laser diode 11 in the optical system 18 will be explained in detail. As illustrated in FIG. 3, the semiconductor laser diode 11 is a monolithic element which has the two light emitting points A1, A2 on the single substrate 20. It is therefore impossible to simultaneously coincide the central axes X1, X2 of the two laser beams with the optical axis Y of the optical system 18 unless the semiconductor laser element 18 is moved. Thus, the central axes of the two laser beams are positioned in the optical system 18, taking into consideration the optical characteristics of the light spot for reading CDs and DVDs.

Generally, for satisfactorily reproducing DVDs and CDs, the wavelength of a light source and the numerical aperture (NA) of an objective lens are defined as shown in Table 1.

TABLE 1

|  | DVD | CD |
|---|---|---|
| Wavelength (nm) | 650 | 780 |
| NA | 0.6 | 0.45 |
| Beam Diameter (assume one for CD) | 1/1.6 | 1 |

Figure 4:
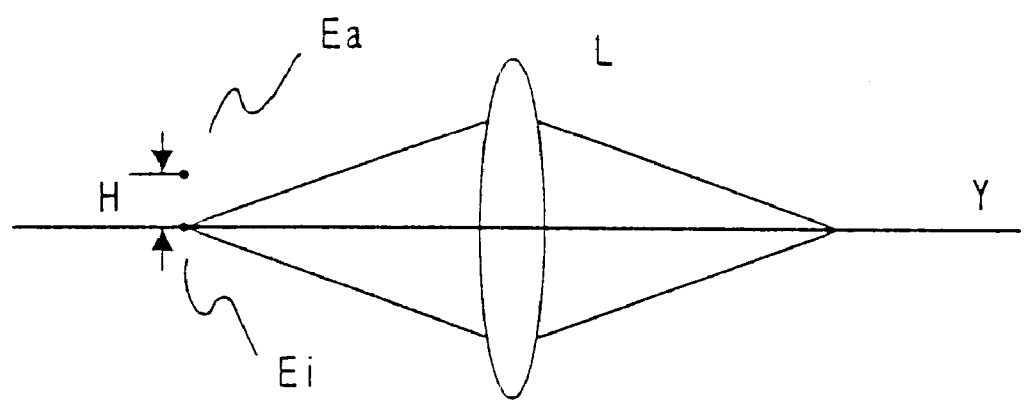
FIG. 4 is a diagram for explaining the concept of "image height"

Generally, it has been found that a lens for converging light can reduce a beam diameter of the converged light as illustrated in FIG. 4 when a light source Ei is positioned on the central axis Y of a lens L. It can therefore be thought that a light source Ei positioned on the central axis Y of the lens L is an ideal light emitting point. However, the actual center Ea of the light source is not always coincident with the optical axis Y, and a light source's deviation from the optical axis Y dominates the optical characteristics as an "image height" H.

Figure 5:
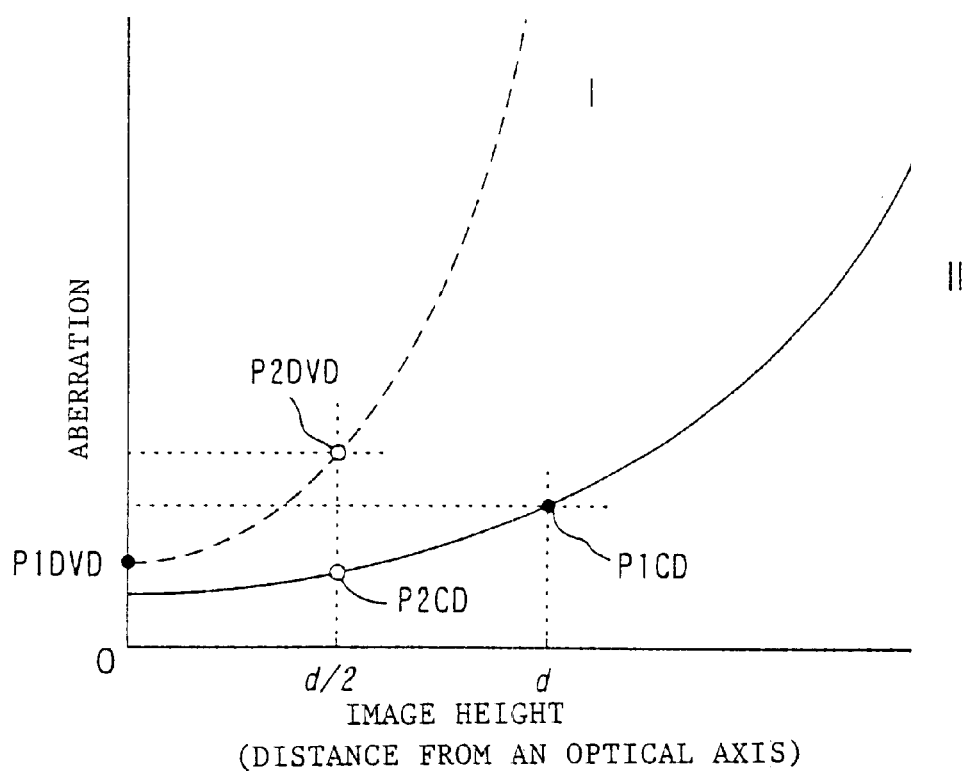
FIG. 5 is a diagram for explaining the relationship between the image height and aberration during DVD reproduction and CD reproduction.

In addition, "aberration" also exists as a factor of degrading the optical characteristics. FIG. 5 shows the relationship between the image height and the aberration of the semiconductor laser diode 11 in the optical system 18 for DVD reproduction and for CD reproduction, respectively. In FIG. 5, a curved line I represents the aberration versus the image height when DVD is reproduced, and a curved line II represents the aberration versus the image height when CD is reproduced.

It is understood from FIG. 5 and Table 1 that the aberration during DVD reproduction is larger than the aberration during CD reproduction regardless of the image height since NA for DVDs is larger than that for CDs, and the beam diameter for DVDs is smaller than that for CDs. It is also understood that the increasing rate of the aberration during DVD reproduction (the slope of the curved line I) is larger than the increasing rate of the aberration during CD reproduction. It is further understood that when the image height equals zero, i.e., when the light emitting point is positioned on the optical axis, the aberration during DVD reproduction is larger than the aberration during CD reproduction.

Figure 6:
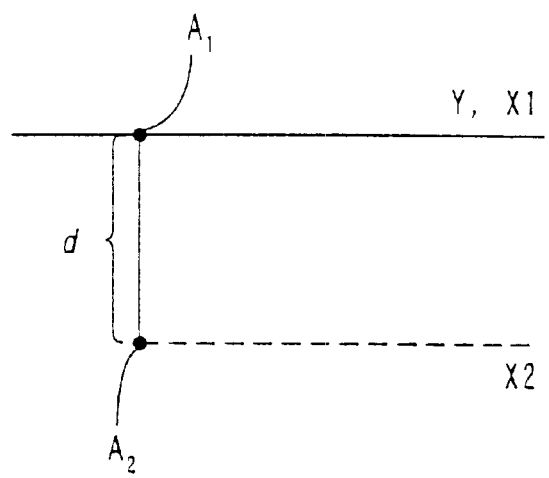
FIG. 6 is a diagram illustrating an embodiment of a positional relationship among a central axis and two laser beams according to the present invention.
Figure 7:
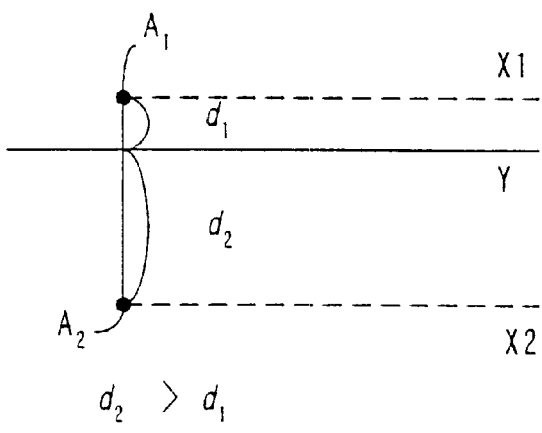
FIG. 7 is a diagram illustrating another embodiment of the positional relationship among the central axis and the two laser beams according to the present invention.

Thus, for suppressing the aberration to a minimum in both DVDs and CDs in consideration of the relationship between the image height and the aberration, two sets of positioning illustrated in FIGS. 6 and 7 are assumed to be appropriate as the positional relationship among the central axes of the two beams emitted by the semiconductor laser diode 11 and the optical axis Y of the optical system 18.

Positioning (1): As illustrated in FIG. 6, a light emitting point during DVD reproduction, i.e., the first light emitting point A1 is positioned on the optical axis Y to coincide the central axis of the first laser beam with the optical axis Y, while a light emitting point during CD reproduction, i.e., the second light emitting point A2 is spaced from the optical axis by a distance d to position the central axis of the second laser beam away from the optical axis of the optical system by the distance d.

Positioning (2): As illustrated in FIG. 7, the first light emitting point A1 is positioned at a distance dl from the optical axis Y to space the central axis X1 of the first laser beam from the optical axis Y of the optical system by the distance $d_1$, and the second light emitting point A2 is positioned at a distance $d_2$ ($d_2 > d_1$, $d_2 = d - d_1$) from the optical axis Y to space the central axis X2 of the second laser beam from the optical axis Y of the optical system by the distance $d_2$, such that the central axis X1 of the first laser beam is positioned closer to the optical axis Y of the optical system than the central axis X2 of the second laser beam.

Figure 8:
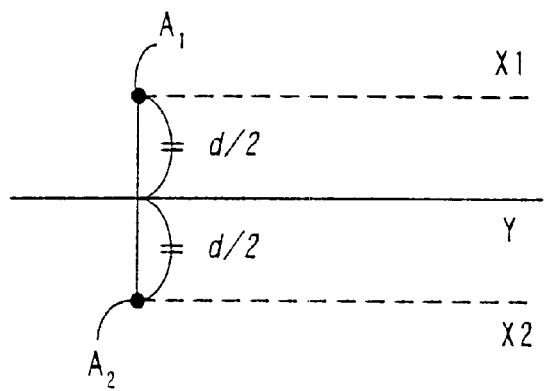
FIG. 8 is a diagram illustrating an example of a positional relationship among the central axis and two laser beams for comparison with the embodiments illustrated in FIGS. 6 and 7.

For reference, FIG. 8 illustrates positioning (3) in which the optical axis Y of the optical system is positioned in the middle of the central axis X1 of the first laser beam and the central axis X2 of the second laser beam.

In the following, the optical characteristics of a light spot in the positioning of FIGS. 6 and 7 will be explained with reference to FIG. 5.

In FIG. 5, a point (P1DVD, P1CD) represents the aberration during DVD and CD reproduction when the positioning (1) is selected, while a point (P2DVD, P2CD) represents the aberration during DVD and CD reproduction when the positioning (3) is selected. As can be seen from FIG. 5, the positioning (3) exhibits large aberration particularly during DVD reproduction. On the other hand, the positioning (1) exhibits minimal aberration during DVD reproduction since the first light emitting spot A1 for DVD lies on the optical axis Y so that the central axis of the first laser beam is coincident with the optical axis of the optical system 18. It is also understood that the aberration during CD reproduction is smaller than the aberration during DVD reproduction with the image height equal to d/2, even if the image height from the optical axis Y is d.

As described above, deteriorations in the optical characteristics by the aberration can be suppressed by positioning the central axis X1 of the first laser beam for DVD reproduction closer to the optical axis Y of the optical system 18 than the central axis X2 of the second laser beam for CD reproduction. Alternatively, the above deteriorations can be suppressed by coinciding the central axis X1 with the optical axis Y of the optical system 18. The suppression is decreased compared with the positioning of the optical axis Y of the optical system 18 in the middle of the central axis of the first laser beam and the optical axis of the second laser beam.

In the foregoing embodiment, a deflection grating, a rising mirror, and a multi-lens may be incorporated in the optical system 18 as required.

Also, while in the foregoing embodiment, the semiconductor laser diode 11 and the photodetector 16 are implemented by separate members, the semiconductor laser diode and the photodetector may be integrally formed on a single substrate as a one-chip element, with elimination of the half mirror 13, to form the optical system.

Further, while in the foregoing embodiment, the semiconductor laser diode is provided with two light emitting points emitting different light wavelengths, three or more light emitting points mutually having different light emitting wavelengths may be provided in a single monolithic laser diode. The position of the central axis of each light emitting point is then adjusted with respect to the optical axis of an optical system including an objective lens, in a manner similar to the foregoing embodiment.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

What is claimed is:

1. An optical pickup apparatus for reading information recorded on two types of recording media at different reading wavelengths, comprising:

a monolithic light-emitting device having a first light emitting portion and a second light emitting portion which are formed on a single substrate of one chip, said first light emitting portion emitting a first laser beam having a first wavelength, and said second light emitting portion emitting a second laser beam having a second wavelength which is longer than said first wavelength; and an optical system, which is optically connected to said monolithic light-emitting device, for guiding each of the first and second laser beams to the recording medium and for guiding a reflected beam from the recording medium to a photodetector, wherein:

said monolithic light-emitting device is so positioned relative to said optical system that a central axis of the first laser beam is closer to an optical axis of said optical system than a central axis of the second laser beam.

2. The optical pickup apparatus of claim 1, wherein said optical system comprises a first optical path for guiding the first laser beam and a second optical path for guiding the second laser beam, wherein the first and second optical paths are provided so that the first optical path is substantially identical with the second optical path.

3. An optical pickup apparatus for reading information recorded on two types of recording media at different reading wavelengths from each other, comprising:

a monolithic light-emitting device having a first light emitting portion and a second light emitting portion which are formed on a single substrate of one chip, said first light emitting portion emitting a first laser beam having a first wavelength, and said second light emitting portion emitting a second laser beam having a second wavelength which is longer than said first wavelength; and an optical system, which is optically connected to said monolithic light-emitting device, for guiding each of the first and second laser beams to the recording medium and for guiding a reflected beam from the recording medium to a photodetector, wherein:

said monolithic light-emitting device is so positioned relative to said optical system that a central axis of the first laser beam is substantially coincident with an optical axis of said optical system.

4. The optical pickup apparatus of claim 3, wherein said optical system comprises a first optical path for guiding the first laser beam and a second optical path for guiding the second laser beam, wherein the first and second optical paths are provided so that the first optical path is substantially identical with the second optical path.

5. An optical pickup apparatus for reading information recorded on two types of recording media at different reading wavelengths from each other, comprising:

a monolithic light-emitting device having a first light emitting portion and a second light emitting portion which are formed on a single substrate of one chip, said first light emitting portion emitting a first laser beam having a first wavelength, and said second light emitting portion emitting a second laser beam having a second wavelength which is longer than said first wavelength; and an optical system, which is optically connected to said monolithic light-emitting device, for guiding each of the first and second laser beams to the recording medium and for guiding a reflected beam from the recording medium to a photodetector, said optical system including an objective lens for limiting an aperture for a beam incident thereon, wherein:

said monolithic light-emitting device is so positioned relative to said optical system that a central axis of the first laser beam is closer to an optical axis of said optical system than a central axis of the second laser beam.

6. The optical pickup apparatus of claim 5, wherein said optical system comprises a first optical path for guiding the first laser beam and a second optical path for guiding the second laser beam, wherein the first and second optical paths are provided so that the first optical path is substantially identical with the second optical path.

7. An optical pickup apparatus for reading information recorded on two types of recording media at different reading wavelengths from each other, comprising:

a monolithic light-emitting device having a first light emitting portion and a second light emitting portion which are formed on a single substrate of one chip, said first light emitting portion emitting a first laser beam having a first wavelength, and said second light emitting portion emitting a second laser beam having a second wavelength which is longer than said first wavelength; and an optical system, which is optically connected to said monolithic light-emitting device, for guiding each of the first and second laser beams to the recording medium and for guiding a reflected beam from the recording medium to a photodetector, said optical system including an objective lens for limiting an aperture for a beam incident thereon, wherein:

said monolithic light-emitting device is so positioned relative to said optical system that a central axis of the first laser beam is substantially coincident with an optical axis of said optical system.

8. The optical pickup apparatus of claim 7, wherein said optical system comprises a first optical path for guiding the first laser beam and a second optical path for guiding the second laser beam, wherein the first and second optical paths are provided so that the first optical path is substantially identical with the second optical path.

* * * * *